United States Patent
Naji

(10) Patent No.: US 6,169,689 B1
(45) Date of Patent: Jan. 2, 2001

(54) MTJ STACKED CELL MEMORY SENSING METHOD AND APPARATUS

(75) Inventor: Peter K. Naji, Phoenix, AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/456,615

(22) Filed: Dec. 8, 1999

(51) Int. Cl.$^7$ ................................................ G11C 9/07
(52) U.S. Cl. .............................................. 365/173; 365/207
(58) Field of Search ............................... 365/2, 158, 200, 365/173, 207, 157

(56) References Cited

U.S. PATENT DOCUMENTS 4,884,235 * 11/1989 Thiele ........................................ 365/2
5,930,164 * 7/1999 Zhu ........................................ 365/158

* cited by examiner

Primary Examiner—Terrell W. Fears
(74) Attorney, Agent, or Firm—William E. Koch

(57) ABSTRACT

Apparatus and method of reading the state of each cell in a stacked memory comprising stacks of cells in an addressable array with each stack including MTJ memory cells stacked together with current terminals connected in series, and including a first and second current terminals coupled through an electronic switch to a current source. Each stack includes $2^n$ levels of memory. A voltage drop across an addressed stack is sensed. Reference voltages equal to the $2^n$ memory levels are provided and the sensed voltage drop is compared to the reference voltages to determine the memory level in the addressed stack. Encoding apparatus is used to convert the voltage drop to a digital output signal.

19 Claims, 2 Drawing Sheets

MTJ STACKED CELL MEMORY SENSING METHOD AND APPARATUS

FIELD OF THE INVENTION

This invention relates to stacks of memory cells having a plurality of memory levels and apparatus for reading the memory level of a stack of memory cells.

BACKGROUND OF THE INVENTION

In today's world of electronic devices, more and larger memories are required. Because of the large number of portable electronic devices, there is a constant pressure to reduce the size of the memories used in the devices while increasing the amount of memory available. Generally, memories used in electronic devices are two dimensional arrays of cells, with each cell in the array individually addressable by means of a row and column connection. Once addressed, the memory state of the individual cell can be easily determined by sensing apparatus that depends upon the specific type of memory cell being used. The difficulty is that in order to increase the capacity of the memory the size of the memory must be increased with the size increasing in direct relationship to the capacity, i.e. doubling the capacity requires a memory with twice the size. Clearly, this can be a serious problem as memory capacity expands almost exponentially. In a related U.S. patent, U.S. Pat. No. 5,930,164, entitled "Magnetic Memory Unit Having Four States and Operating Method Therefor", issued Jul. 27, 1999, stacked magnetic tunneling junction memory cells are used to achieve multistates. The magnetic tunneling junction memory cells and structure are background for the present invention and are incorporated herein by reference.

Accordingly it is highly desirable to provide apparatus which overcomes this problem and which is inexpensive and easy to install and use.

BRIEF DESCRIPTION OF THE DRAWINGS

Referring to the drawings.

DESCRIPTION OF THE PREFERRED EMBODIMENT

Figure 1:
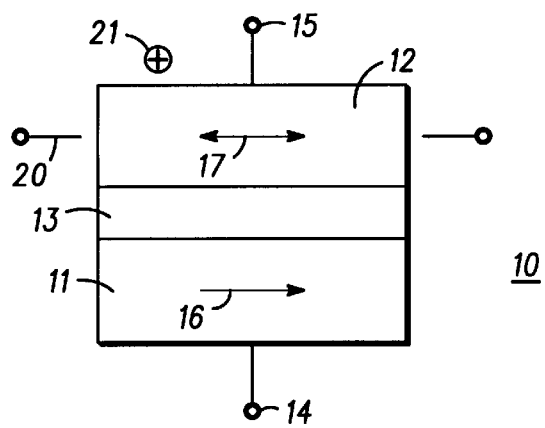
FIG. 1 is a simplified sectional view of a magnetic tunnel junction illustrating the operation thereof.

Turning now to the drawings and specifically to FIG. 1, a simplified sectional view of a magnetic tunnel junction (MTJ) 10 is illustrated for purposes of describing generally the operation thereof. MTJ 10 includes a first layer 11 of magnetic material and a second layer 12 of magnetic material with a thin insulating layer 13 sandwiched therebetween. A read current terminal 14 is electrically connected to layer 11 and a read current terminal 15 is electrically connected to layer 12. Layer 11 is constructed so that a magnetic field therein lies generally parallel with and in the direction of a vector 16. Similarly, layer 12 is constructed so that a magnetic field therein lies generally parallel with and in the direction of a vector 17. For convenience of this description it will be assumed that vector 16 always remains in the direction illustrated (to the right of the page in FIG. 1) and vector 17 is switchable to either point to the left or to the right.

A digitline 20 is positioned adjacent layer 12 so that when a current is passed therethrough a magnetic field is produced in layer 12 which can change the direction of vector 17. The direction of the current determines the direction of the magnetic field produced and, consequently, the direction in which vector 17 is placed. In some applications it may be convenient to provide a second source of magnetic field, such as a bitline 21, illustrated as being positioned adjacent layer 12 and extending into and out of the figure. In such applications a current in both digitline 20 and bitline 21 is required to switch vector 17 in layer 12. In programming or 'write' modes the two line embodiment is convenient for addressing a specific cell in a two dimensional array of cells.

Generally, MTJ 10 has two memory states, one in which vectors 16 and 17 are aligned and the resistance between terminals 14 and 15 is a minimum, and one in which vectors 16 and 17 are opposite or misaligned and the resistance between terminals 14 and 15 is a maximum. There are a variety of ways in which the maximum and/or the minimum resistances can be varied but generally, the standard methods are to either vary the thickness of layer 13 and/or vary the horizontal area of the layers 11, 12, and 13. Additional information on MTJs is available in U.S. Pat. No. 5,702,831, entitled "Multi-Layer Magnetic Tunneling Junction Memory Cells", issued Mar. 31 1998, which is incorporated herein by reference.

Figure 2:
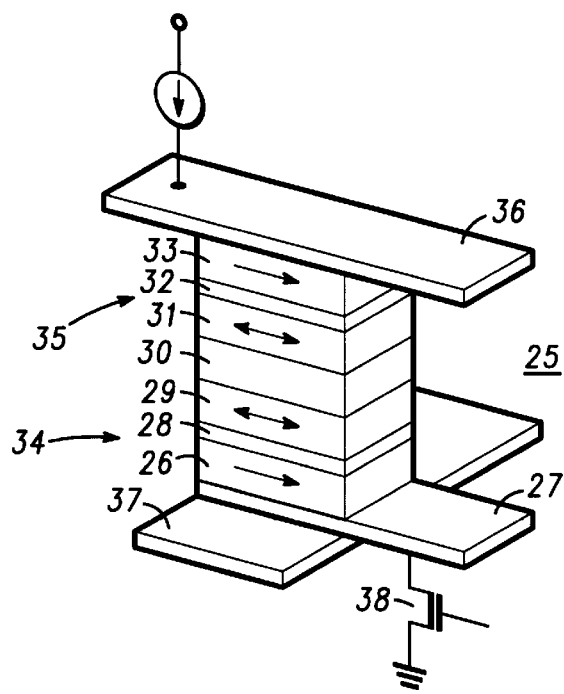
FIG. 2 is a simplified sectional view of a stack of magnetic tunnel junctions illustrating the operation thereof.

Turning now to FIG. 2, a simplified sectional view of a stack 25 of magnetic tunnel junctions is illustrated to describe the operation thereof. A first magnetic layer 26 is positioned on a current carrying element 27. A thin insulating layer 28 is formed on the upper surface of layer 26 and a second magnetic layer 29 is formed on the upper surface of insulating layer 28. An electrically conductive layer 30 is formed on the upper surface of layer 29. A third magnetic layer 31 is formed on the upper surface of layer 30 with a thin insulating layer 32 formed on the upper surface of magnetic layer 31 and a fourth magnetic layer 33 formed on the upper surface of insulating layer 32. Layers 26, 28, and 29 form a first MTJ cell 34 and layers 30, 31, and 32 form a second MTJ cell 35. A second current carrying element (bitline) 36 is positioned on and in electrical contact with fourth magnetic layer 33.

A digitline 37 is positioned below current carrying element 27 (as shown in FIG. 2), and is insulated from element 27, so as to provide a portion of a magnetic field for programming stack 25. Here it should be noted that digitline 37 is positioned as shown for convenience in manufacturing and addressing since it can be very conveniently deposited on a substrate or the like with connections formed at the ends (adjacent the outer limits of an array of cells). For example, digitline 37 can be formed during a metalization step in the formation of a switching transistor 38 associated with current carrying elements 27 and 36. A thin insulating layer can then be deposited and stack 25 can be conveniently formed on the thin insulating layer as described.

As previously described, magnetic layer 26 has a magnetic vector which is fixed in the position shown, for convenience. Magnetic layers 29 and 31 have switchable magnetic vectors which are switchable between aligned and misaligned states, by means of external magnetic fields (produced by combinations of currents in bitline 36 and digitline 37). Generally, high or low resistance in MTJ 34 is determined by the position of the magnetic vector in layer 29 relative to the magnetic vector in layer 26. Similarly, high or low resistance in MTJ 35 is determined by the position of the magnetic vector in layer 31 relative to the magnetic vector in layer 33. In a similar fashion, additional layers can be added to provide additional MTJs in the stack.

Figure 3:
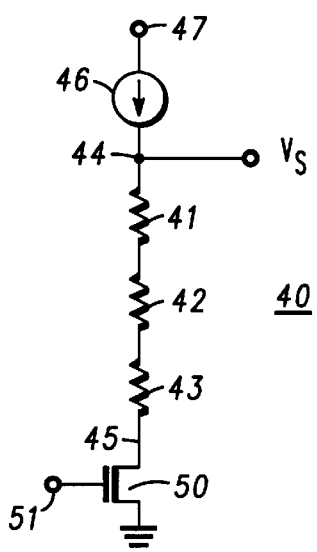
FIG. 3 is a schematic diagram of a stack of magnetic tunnel junctions in accordance with the present invention.

Referring additionally to FIG. 3, a schematic diagram of a stack 40 of magnetic tunnel junctions connected in accordance with the present invention is illustrated. Stack 40 includes three MTJs 41, 42, and 43, represented by a simple resistance symbol. A read current terminal 44 at the top of stack 40 is electrically connected to MTJ 41 and a read current terminal 45 at the bottom of stack 40 is electrically connected to MTJ 43. Read current terminal 44 is also connected to a current source 46, which is in turn connected to an external power source through a terminal 47, and to a signal voltage (Vs) output terminal. Read current terminal 45 is connected through an electronic switch 50 to a current return or common, such as ground or the like.

Switch 50 can be any of a variety of devices, including for example thin-film-transistors (TFT), MOS field effect transistors, pn junction diodes, polysilicon diodes, or the like. Switch 50 has a control terminal 51 which is used to turn on stack 40 to allow current to flow therethrough from current source 46. The voltage drop across stack 40 is then measured at terminal Vs. Referring specifically to FIG. 2, support 27 can be, for example, a semiconductor substrate with switch 50 fabricated therein prior to the formation of stack 25. Here it should be noted that the number of memory cells or MTJs in a stack determines the number of memory levels that can be achieved, with the rule being n cells provide $2^n$ memory levels. Thus, in stack 40, which includes three MTJs, there are $2^3$ or eight memory levels provided.

Figure 4:
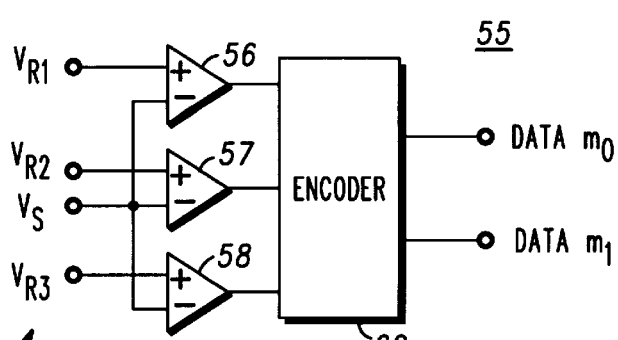
FIG. 4 is a schematic diagram of a comparator in accordance with the present invention.

Referring additionally to FIG. 4, a simple analog to digital converter (ADC) 55 in accordance with the present invention is illustrated for use with a memory stack in which the cells have different resistances. ADC 55 includes three comparators 56, 57, and 58, each having a negative input terminal connected to receive a Vs output signal from a stack of MTJs. The positive input terminals for each comparator 56, 57, and 58 are connected to a voltage reference source $V_{R1}$, $V_{R2}$, and $V_{R3}$, respectively. $2^n - 1$, in this example three, reference voltages are used for $2^n$ memory levels. For simplicity of this description, a two MTJ stack, or four level comparator is illustrated. The outputs of comparators 56, 57, and 58 are connected to an encoder 60 which converts the three bit outputs to two bits and supplies them at output terminals m0 and m1.

As an example of the operation of ADC 55 and using the two MTJ stack of FIG. 2 for example, when all four magnetic vectors in layers 26, 29, 31, and 33 are in the aligned state the resistance of MTJ 34 in this magnetic state is R1 and the resistance of MTJ 35 in this magnetic state is R2. When the magnetic vectors in layers 26 and 29 are misaligned the resistance of MTJ 34 in this magnetic state is R1+ΔR1 and when the magnetic vectors in layers 31 and 33 are misaligned the resistance of MTJ 35 in this magnetic state is R2+ΔR2. Here it should be clear that R1 does not equal R2 and R1+ΔR1 does not equal R2+ΔR2. A table of the resistances for MTJ 34 and 35 and the outputs of encoder 60 is set forth below.

| m0 | m1 | Vs |
|---|---|---|
| 0 (R1) | 0 (R2) | R1 + R2 |
| 0 (R1) | 1 (R2 + ΔR2) | R1 + R2 + ΔR2 |
| 1 (R1 + ΔR1) | 0 (R2) | R1 + ΔR1 + R2 |
| 1 (R1 + ΔR1) | 1 (R2 + ΔR2) | R1 + R2 + ΔR1 + ΔR2 |

To achieve the appropriate sensing and comparing, the reference voltages generated and applied to inputs $V_{R1}$, $V_{R2}$, and $V_{R3}$ are, for example, as follows:

$V_{R1}$ equals $R1+R2+\Delta R1/2$;

$V_{R2}$ equals $R1+R2+\Delta R1+(\Delta R1-\Delta R2)/2$;

and $V_{R3}$ equals $R1+R2+\Delta R2+\Delta R1/2$.

Here it will be understood that the reference voltages set forth above are in the nature of examples or limits and any reference voltages that are capable of differentiating between the various possible resistances (e.g. R1+R2; R1+ΔR1+R2; R1+R2+ΔR2; and R1+ΔR1+R2+ΔR2 in the above example) are acceptable. Thus, in this example the first reference voltage should lie clearly between R1+R2 and R1+R2+ΔR2; the second reference voltage should lie clearly between R1+R2+ΔR2 and R1+ΔR1+R2; and the third reference voltage should lie clearly between R1+ΔR1+R2 and R1+ΔR1+R2+ΔR2.

Figure 5:
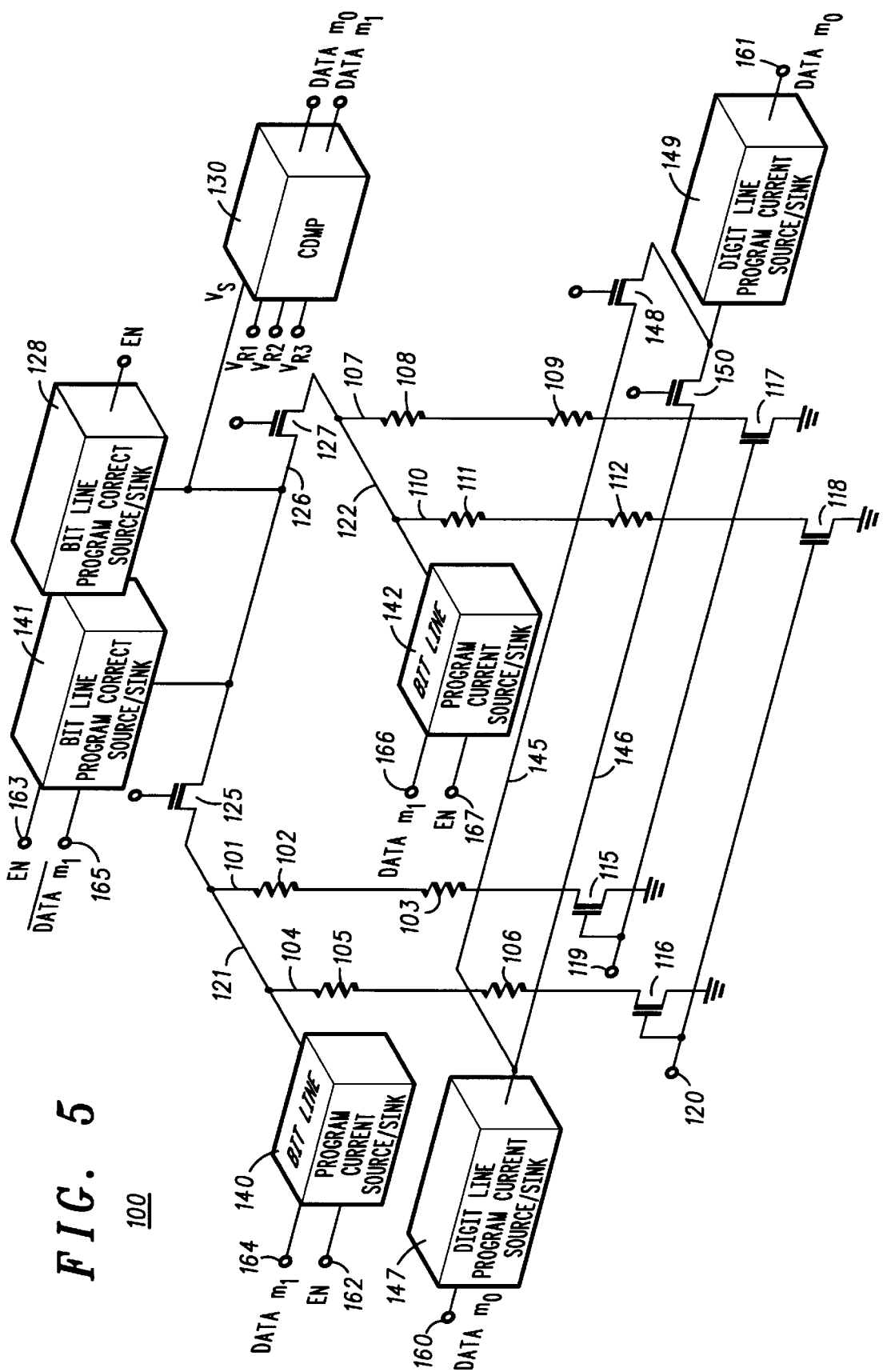
FIG. 5 is a schematic diagram of a specific embodiment of a stacked memory with sensing apparatus in accordance with the present invention.

Turning now to FIG. 5, a schematic diagram is illustrated of a specific embodiment of a simplified stacked memory 100 in accordance with the present invention. Memory 100 is illustrated in a simplified form in that only a 2×2×2 array of memory cells is used to facilitate the description process. It should be understood however, that virtually any number of cells might be utilized with the stacking being limited only by the comparing and encoding circuitry or limitations of programming the stacks of cells. In this specific embodiment, memory 100 includes a first stack 101 of two cells 102 and 103, a second stack 104 of two cells 105 and 106, a third stack 107 of two cells 108 and 109 and a fourth stack 110 of two cells 111 and 112.

The lower current terminals of stacks 101, 104, 107, and 110 are connected through switches 115, 116, 117, and 118, respectively, to a current return, which in this embodiment is ground. The gates or control terminals of switches 115 and 117 are connected together to a first read (row) input terminal 119 and the gates of switches 116 and 119 are connected together to a second read (row) input terminal 120. The upper current terminals of stacks 101 and 104 are connected to a bitline 121 and the upper current terminals of stacks 107 and 110 are connected to a bitline 122. Bitline 121 is connected through a switch 125 to a data line 126 and bitline 122 is connected through a switch 127 to data line 126. The gate of switch 125 is connected to a third read (column) signal and the gate of switch 127 is connected to a fourth read (column) signal. Dataline 126 is connected to a bitline READ current source 128 and as the Vs input to a comparator 130. Comparator 130 is substantially similar to analog to digital converter (ADC) 55 of FIG. 4, with three reference voltage inputs, i.e. $2^n-1$ (in this example 3) reference voltages for $2^n$ (i.e. $2^2$ or 4) memory levels per stack.

Thus, to read the information stored in stack 101, for example, stack 101 is addressed by supplying a read signal to the gate of switch 115 by way of terminal 119 and, simultaneously, supplying a read signal to the gate of switch 125. In this process stack 101, and only stack 101, conducts a READ current sourced by bitline READ current source 128, and voltage across stack 101 is sampled by comparator 130. Similarly, stack 104 is addressed by supplying a read signal to switches 116 and 125, stack 107 is addressed by supplying a read signal to switches 117 and 127, and stack 110 is addressed by supplying a read signal to switches 118 and 127. The information stored in the eight cells is communicated to comparator 130 where it is encoded into digital signals.

One end of bitline 121 is connected to a bitline PROGRAM current source/sink 140 and one end of bitline 122 is connected to a bitline PROGRAM current source/sink 142. Here it should be understood that the current source/sink circuits are constructed and switchable to provide current in either direction through the attached lines, hence, the designation source/sink. A bitline PROGRAM current source/sink 141 is connected to data line 126 and cooperates with bitline PROGRAM current source/sink 140 or bitline PROGRAM current source/sink 142 to provide PROGRAM or WRITE current through either bitline 121 or bitline 122 in a PROGRAM or WRITE mode. Also, a first digitline 145 is positioned under (see FIG. 2) the programmable layers of stacks 101 and 107 while a second digitline 146 is positioned under the programmable layers of stacks 104 and 110. One end of each digitline 145 and 146 is connected to a digitline PROGRAM current source/sink 147. The other end of digitline 145 is connected through a switch 148 to a second digitline PROGRAM current source/sink 149 and the other end of digitline 146 is connected through a switch 150 to digitline PROGRAM current source/sink 149.

To write data into stack 101, for example, switch 125 is closed to allow current to flow in bitline 121 between bitline PROGRAM current source/sinks 140 and 141. Also, switch 148 is closed to allow current to flow in digitline 146 between digitline PROGRAM current source/sinks 147 and 149. As explained in conjunction with FIG. 1, the direction of the currents in the bitlines and digitlines determines the magnetic vector position and, consequently, the information stored in the cells. Thus, PROGRAM current source/sinks 140, 141, 142, 147, and 149 are constructed to allow the flow of current in either direction through bitlines 121 and 122 and digitlines 145 and 146. The direction of the current flow in the PROGRAM current source/sinks depends upon the logic values of inputs DATA m0 and DATA m1 (designated 160, 161, 164, 165, and 166 in FIG. 5) to PROGRAM current source/sinks 140, 141, 142, 147, and 149. In a similar fashion, stack 104 is programmed by closing switches 125 and 150, stack 107 is programmed by closing switches 127 and 148, and stack 110 is programmed by closing switches 127 and 150.

Each of the cells of a stack can be programmed '1' or '0'. If both cells of a stack are programmed '0' or both cells are programmed '1', a higher strength magnetic field is needed compared to a 01 or 10 program. In a typical programming sequence in which both cells of stack 101 are programmed to store a '0', switch 148 is closed and current representative of a '0' is applied to digitline 146 by applying the appropriate DATA m0 logic to terminal 160 in digitline PROGRAM current source/sink 147 and inverse DATA m0 logic to terminal 161 of digitline PROGRAM current source/sink 149. Simultaneously, switch 125 is closed and current is applied to bitline 121 by supplying the desired DATA m1 logic to terminal 164 of bitline PROGRAM current source/sink 140 and inverse DATA m1 logic to terminal 165 of bitline PROGRAM current source/sink 141. In this fashion each cell 101 and 102 is programmed to store a '0'. In a similar fashion each cell in each of the other stacks 104, 107, and 110 can be addressed and programmed to store a '0'.

In the same programming sequence, in which both cells of stack 101 are programmed to store a '1', the various switches remain in the same position but the current representative of a '1' is applied to digitline 146 by switching DATA m0 logic to the opposite state on terminal 160 of digitline PROGRAM current source/sink 147 and applying the inverse DATA m0 logic on terminal 161 of digitline PROGRAM current source/sink 149.

To program stack 101, for example, with '01' data, a two step process is used in this embodiment. The first step uses the same procedure as used above to program each cell 101 and 102 with a '0'. In a second step, the same switch settings are used and less current is supplied to bit line 121 by bitline PROGRAM current source/sinks 140 and 141, but in the opposite direction relative to the direction of the 00 programming. The opposite current direction is achieved by switching DATA m1 logic on terminals 164 and 165 to the opposite state relative to the state used during 00 programming. In a similar fashion each cell in each of the other stacks 104, 107, and 110 can be addressed and programmed to store a '01'.

To program stack 101, for example, with '10' data, a two step process is again used in this embodiment. The first step uses the same procedure as used above to program each cell 101 and 102 with a '1'. In a second step, the same switch settings are used and less current is supplied to bit line 121 by bitline PROGRAM current source/sinks 140 and 141 but in the opposite direction relative to the state used during the 11 programming. In a similar fashion each cell in each of the other stacks 104, 107, and 110 can be addressed and programmed to store a '10'.

Thus, a stacked memory is disclosed in which virtually any number of cells can be stacked vertically and the stacks can be arranged in an array with apparatus connected to address individual stacks for programming and for reading stored data. Because the cells are stacked vertically the capacity of the memory can be doubled, tripled, etc. without taking additional chip space. Also, the stacked memory can be easily programmed with little additional apparatus and can be read with only the addition of voltage sensing and comparing apparatus including a comparator circuit and reference voltages.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of reading the state of each cell in a stacked memory comprising the steps of:

providing a stack of cells including a plurality n of magnetic tunnel junction memory cells stacked together with current terminals connected in series, and including a first read current terminal of a first cell in the stack and a second read current terminal coupled to an electronic switch, the stack of cells including $2^n$ levels of memory;

providing a plurality of reference voltages representative of the $2^n$ memory levels;

sensing a voltage drop across the stack of cells;

comparing the sensed voltage drop to the plurality of reference voltages to determine the memory level of the plurality n of cells in the stack of cells; and encoding the determined memory level to provide an output signal for the stack of cells.

2. A method of reading the state of each cell in a stacked memory as claimed in claim 1 wherein the step of encoding includes providing a digital output signal.

3. A method of reading the state of each cell in a stacked memory as claimed in claim 2 wherein the step of encoding includes providing a binary output signal.

4. A method of reading the state of each cell in a stacked memory comprising the steps of:

providing a plurality of stacks of cells, each stack of cells including a plurality n of magnetic tunnel junction memory cells stacked together with current terminals connected in series, each stack of cells including a first read current terminal of a first cell in the stack and a second read current terminal coupled to an electronic switch, and each stack of cells includes $2^n$ levels of memory;

coupling the plurality of stacks of cells into an array of stacks of cells with each stack of cells being individually addressable;

providing a plurality of reference voltages equal to the $2^n$ memory levels;

addressing an individual stack of cells in the array by providing access to the first read current terminal of the addressed individual stack of cells;

sensing a voltage drop across the addressed stack of cells by applying a current through the addressed stack of cells;

comparing the sensed voltage drop to the plurality of reference voltages to determine the memory level of the plurality n of cells in the addressed stack of cells; and encoding the determined memory level for each of the addressed stack of cells to provide an output signal for each of the addressed stack of cells.

5. A method of reading the state of each cell in a stacked memory as claimed in claim 4 wherein the step of encoding includes providing a digital output signal for each of the addressed stack of cells.

6. A method of reading the state of each cell in a stacked memory as claimed in claim 5 wherein the step of encoding includes providing a binary output signal for each of the addressed stack of cells.

7. A stacked memory comprising:

a plurality of magnetic tunnel junction memory cells each cell having a switchable magnetic layer, a first READ current terminal and a second READ current terminal, each cell in the plurality of magnetic tunnel junction memory cells having a first resistance in a first memory state and a second resistance, different than the first resistance, in a second memory state;

the plurality of magnetic tunnel junction memory cells being stacked together with the current terminals connected in series;

an electronic switch;

a first READ current terminal of a first cell in the plurality of magnetic tunnel junction memory cells being coupled to a READ current source and a second READ current terminal of a final cell in the plurality of magnetic tunnel junction memory cells being coupled through the electronic switch to a READ current return to define a stack of cells;

reference apparatus providing a plurality of reference voltage levels;

voltage sensing and comparing apparatus coupled to the first READ current terminal of the first cell in the plurality of magnetic tunnel junction memory cells and to the reference apparatus for sensing a voltage dropped across the stack of cells with a current applied through the stack of cells and comparing the sensed voltage to the plurality of reference voltage levels to determine the state of each cell in the stack of cells; and encoding apparatus coupled to the voltage sensing and comparing apparatus for converting the voltage dropped across the stack of cells to a digital output signal.

8. A stacked memory as claimed in claim 7 wherein the plurality of magnetic tunnel junction memory cells is greater than two cells.

9. A stacked memory as claimed in claim 7 wherein the stack of cells include n cells with $2^n$ levels and the multi-level comparator has a number of levels at least equal to $2^n - 1$ levels.

10. A stacked memory as claimed in claim 7 including a plurality of stacks of cells, the plurality of stacks of cells being coupled into an array with each stack in the array being individually addressable.

11. A stacked memory as claimed in claim 7 including in addition a digitline mounted beneath the final cell in the plurality of magnetic tunnel junction memory cells.

12. A stacked memory comprising:

a plurality of stacks of cells, each stack of cells including a plurality of magnetic tunnel junction memory cells stacked together with current terminals connected in series, a first read current terminal of a first cell in each of the plurality of stacks of cells being coupled to a read current source and a second read current terminal of a final cell in each of the plurality of stacks of cells being coupled through an electronic switch to a read current return;

circuitry coupling the plurality of stacks of cells into an array, the circuitry including a digitline associated with each stack of cells in the plurality of stacks of cells for programming the associated stack of cells, the digitline associated with each stack of cells being positioned below the second read current terminal of the final cell in the associated stack of cells;

the circuitry and the electronic switches coupled to each of the stacks of cells being controllable to address each individual stack of cells in the array by providing access to the first read current terminal of an addressed stack of cells;

reference apparatus providing a plurality of reference voltage levels;

voltage sensing and comparing apparatus coupled to the first read current terminal of the addressed stack of cells and to the reference apparatus for sensing a voltage dropped across the addressed stack of cells with a current applied through the addressed stack of cells and comparing the sensed voltage to the plurality of reference voltage levels to determine the state of each cell in the addressed stack of cells; and encoding apparatus coupled to the voltage sensing and comparing apparatus for converting the voltage dropped across the addressed stack of cells to a digital output signal.

13. A stacked memory as claimed in claim 12 wherein the plurality of magnetic tunnel junction memory cells is two cells.

14. A stacked memory as claimed in claim 12 wherein the plurality of magnetic tunnel junction memory cells is greater than two cells.

15. A stacked memory as claimed in claim 12 wherein the stack of cells include n cells with $2^n$ levels and the multi-level comparator has a number of levels at least equal to $2^n-1$ levels.

16. A stacked memory as claimed in claim 12 including a plurality of stacks of cells, the plurality of stacks of cells being coupled into an array with each stack in the array being individually addressable.

17. A stacked memory comprising:

a plurality of stacks of cells, each stack of cells including a plurality of magnetic tunnel junction memory cells stacked together with current terminals connected in series, a first read current terminal of a first cell in each of the plurality of stacks of cells being coupled to a read current source and a second read current terminal of a final cell in each of the plurality of stacks of cells being coupled through an electronic switch to a read current return;

circuitry coupling the plurality of stacks of cells into an array, the circuitry including a digitline associated with each stack of cells in the plurality of stacks of cells for programming the associated stack of cells, the digitline associated with each stack of cells being positioned below the second read current terminal of the final cell in the associated stack of cells;

the circuitry and the electronic switches coupled to each of the stacks of cells being controllable to address each individual stack of cells in the array by providing access to the first read current terminal of an addressed stack of cells;

reference apparatus providing a plurality of reference voltage levels; and voltage sensing and comparing apparatus coupled to the first read current terminal of the addressed stack of cells and to the reference apparatus for sensing a voltage dropped across the addressed stack of cells with a current applied through the addressed stack of cells and comparing the sensed voltage to the plurality of reference voltage levels to determine the state of each cell in the addressed stack of cells; and encoding apparatus coupled to the voltage sensing and comparing apparatus for converting the voltage dropped across the addressed stack of cells to a digital output signal.

18. A stacked memory as claimed in claim 17 wherein each stack of cells in the plurality of stacks of cells has more than two cells.

19. A stacked memory as claimed in claim 17 wherein the voltage sensing and comparing apparatus includes a multi-level comparator and each stack of cells of the plurality of stacks of cells include n cells with $2^n$ levels and the multi-level comparator has a number of levels at least equal to $2^n-1$ levels.

* * * * *

UNITED STATES PATENT AND TRADEMARK OFFICE
CERTIFICATE OF CORRECTION

PATENT NO.    : 6,169,689 B1
DATED         : January 2, 2001
INVENTOR(S)   : Naji It is certified that error appears in the above-identified patent and that said Letters Patent is hereby corrected as shown below:

<u>Title page,</u>
After the Title, please add as a new first paragraph the following paragraph:

-- This invention was made with Government support under Agreement No. MDA972-96-3-0016 awarded by DARPA. The Government has certain rights in the invention. --

Signed and Sealed this

Seventh Day of October, 2003

JAMES E. ROGAN
*Director of the United States Patent and Trademark Office*